(12) United States Patent
Ma

(10) Patent No.: US 12,166,032 B2
(45) Date of Patent: Dec. 10, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Ching-Lun Ma, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 615 days.

(21) Appl. No.: 17/446,015

(22) Filed: Aug. 26, 2021

(65) Prior Publication Data

US 2022/0139902 A1 May 5, 2022

Related U.S. Application Data

(63) Continuation of application No. PCT/CN2021/101902, filed on Jun. 23, 2021.

(30) Foreign Application Priority Data

Nov. 4, 2020 (CN) .......................... 202011219025.2

(51) Int. Cl.
*H01L 27/02* (2006.01)
*H10B 12/00* (2023.01)

(52) U.S. Cl.
CPC ..... *H01L 27/0251* (2013.01); *H10B 12/0335* (2023.02); *H10B 12/05* (2023.02); *H10B 12/315* (2023.02)

(58) Field of Classification Search
CPC ............. H01L 27/1207; H01L 27/0251; H01L 27/1203; H01L 27/1255; H10B 12/0335; H10B 12/05; H10B 12/09; H10B 12/315
See application file for complete search history.

(56) References Cited

U.S. PATENT DOCUMENTS

| 6,433,381 | B2 | 8/2002 | Mizutani |
| 6,524,917 | B2 | 2/2003 | Lichter |
| 6,794,244 | B2 | 9/2004 | Mizutani |
| 10,756,102 | B2 | 8/2020 | Huo et al. |
| 2002/0014648 | A1 | 2/2002 | Mizutani |
| 2002/0153548 | A1 | 10/2002 | Mizutani |

(Continued)

FOREIGN PATENT DOCUMENTS

| CN | 1267915 A | 9/2000 |
| CN | 107946193 A | 4/2018 |

(Continued)

*Primary Examiner* — Britt D Hanley
*Assistant Examiner* — Kevin Quinto
(74) *Attorney, Agent, or Firm* — Syncoda LLC; Feng Ma

(57) ABSTRACT

A semiconductor structure includes a substrate, a gate dielectric layer and a conductive layer that are stacked, and the gate dielectric layer is located between the substrate and the conductive layer. The substrate includes a semiconductor substrate and an insulating substrate which are arranged on the same layer. The conductive layer includes: a gate conductor layer, a projection of which on the substrate covers the semiconductor substrate, and an external connecting layer, a projection of which on the substrate covers the insulating substrate. A groove is formed on a bottom surface, towards the substrate, of the external connecting layer and the groove is filled with an insulator.

12 Claims, 22 Drawing Sheets

(56) References Cited

U.S. PATENT DOCUMENTS

2009/0194810 A1* 8/2009 Kiyotoshi ............. H10B 41/41
                                                    257/E21.546
2019/0157287 A1   5/2019 Huo et al.

FOREIGN PATENT DOCUMENTS

| CN | 109003937 A | 12/2018 |
| CN | 109148376 A | 1/2019 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation of International Application No. PCT/CN2021/101902 filed on Jun. 23, 2021, which claims priority to Chinese Patent Application No. 202011219025.2 filed on Nov. 4, 2020. The disclosures of these applications are hereby incorporated by reference in their entirety.

BACKGROUND

With the gradual development of a storage device, the Dynamic Random Access Memory (DRAM) is gradually applied to various electronic devices because of its higher density and higher speed of reading and writing. The DRAM includes a transistor structure and a capacitor structure electrically connected to the transistor structure. Data stored in the capacitor structure may be read through the transistor structure or data may be written into the capacitor structure through the transistor structure.

SUMMARY

Various embodiments of the present disclosure relate to the field of semiconductor manufacture, and provide a semiconductor structure and a method for manufacturing a semiconductor structure.

In a first aspect, the embodiment of the present disclosure provides a semiconductor structure, which may include a substrate, a gate dielectric layer and a conductive layer that are stacked. The gate dielectric layer may be located between the substrate and the conductive layer. The substrate may include a semiconductor substrate and an insulating substrate which are arranged on the same layer. The conductive layer may include: a gate conductor layer, a projection of which on the substrate may cover the semiconductor substrate, and an external connecting layer, a projection of which on the substrate may cover the insulating substrate. A groove may be formed on a bottom surface, towards the substrate, of the external connecting layer, and the groove may be filled with an insulator.

In a second aspect, the embodiment of the present disclosure further provides a method for manufacturing a semiconductor structure, which may include the following operations.

A substrate may be provided, herein, the substrate may include a semiconductor substrate and an insulating substrate which are arranged on the same layer.

A gate dielectric layer, a first conductive layer, a second conductive layer and an insulating covering layer that are stacked may be formed on the substrate, herein, the insulating covering layer may cover the first conductive layer and the substrate.

A mask layer may be formed on the insulating covering layer, herein, the mask layer may have an etching hole, and a projection of a part of the etching hole on the insulating substrate may overlap with a projection of the second conductive layer on the insulating substrate.

The insulating covering layer corresponding to the etching hole may be removed to form a channel, herein, the channel at least may extend into the gate dielectric layer.

At least part of the first conductive layer, a projection of which is located on the insulating substrate, may be removed through the channel to form a groove.

An insulator may be formed, through the channel, in the groove.

BRIEF DESCRIPTION OF THE DRAWINGS

In order to more clearly describe the technical solutions of the embodiments of the present disclosure and of the related art, drawings that need to be used in the embodiments and the related art will be briefly described below. It is apparent that the drawings in the following description are only some embodiments of the present disclosure, from which other drawings may be acquired by those of ordinary skill in the art without paying any creative labor.

DESCRIPTION OF REFERENCE NUMERALS

Figure 1:
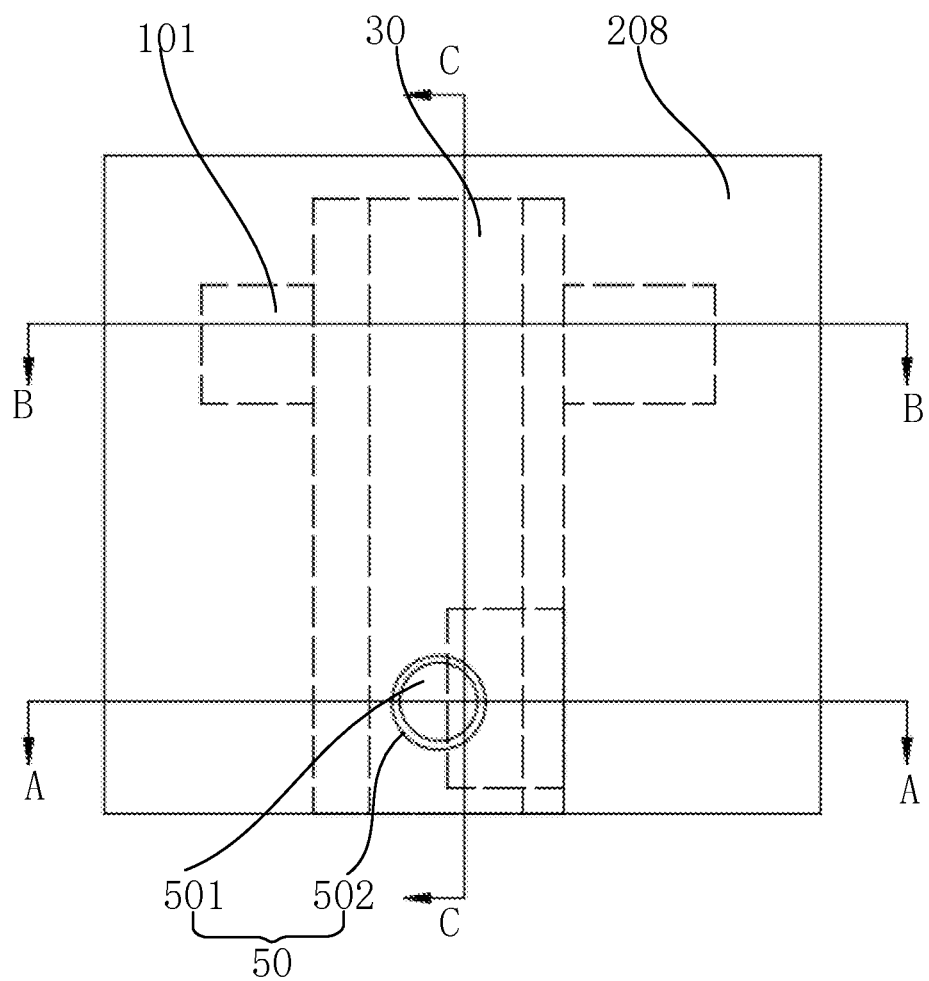
FIG. 1 is a top view of a semiconductor structure provided in an embodiment of the present disclosure.
Figure 2:
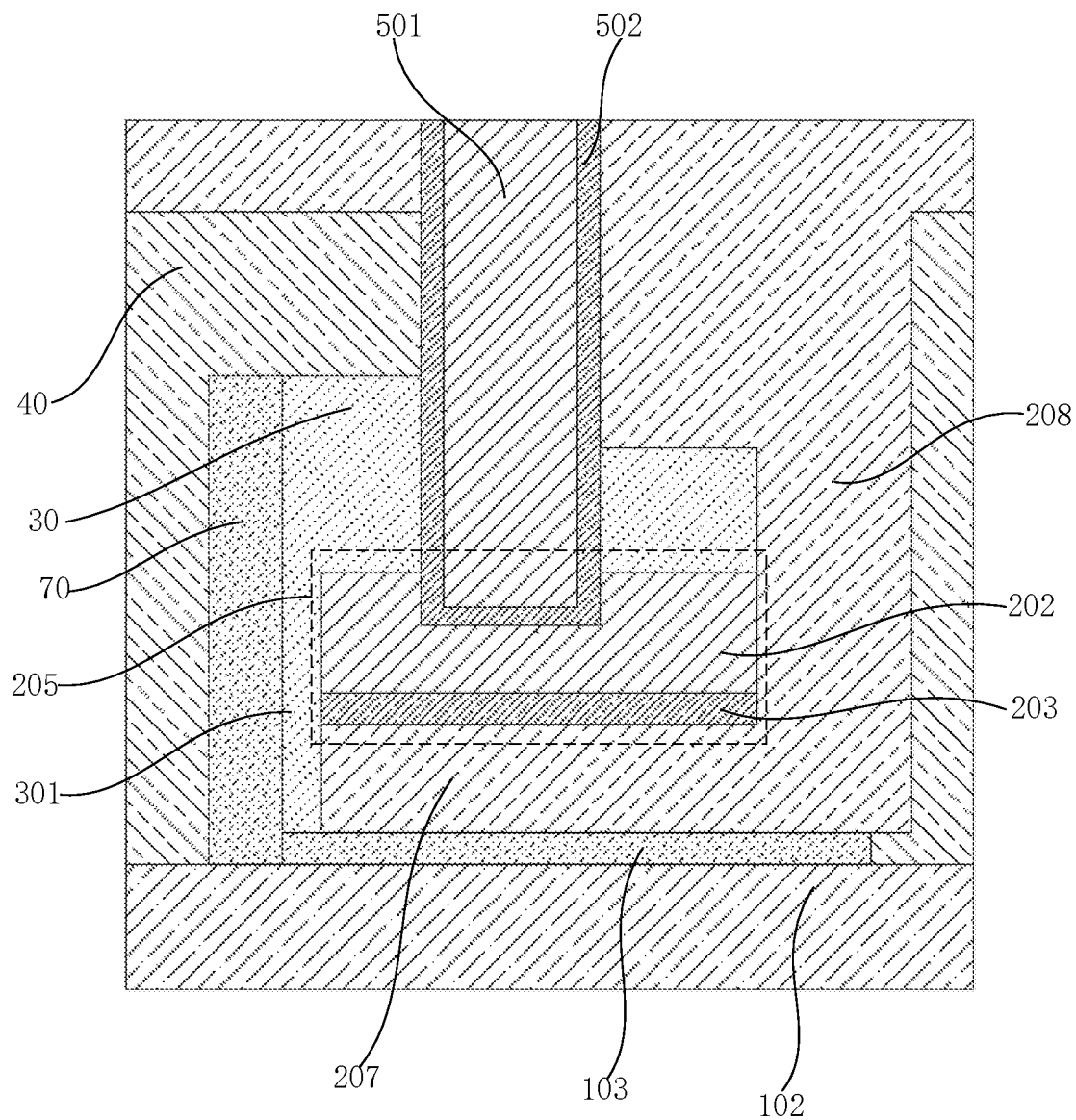
FIG. 2 is a sectional view in an A-A direction in FIG. 1.
Figure 3:
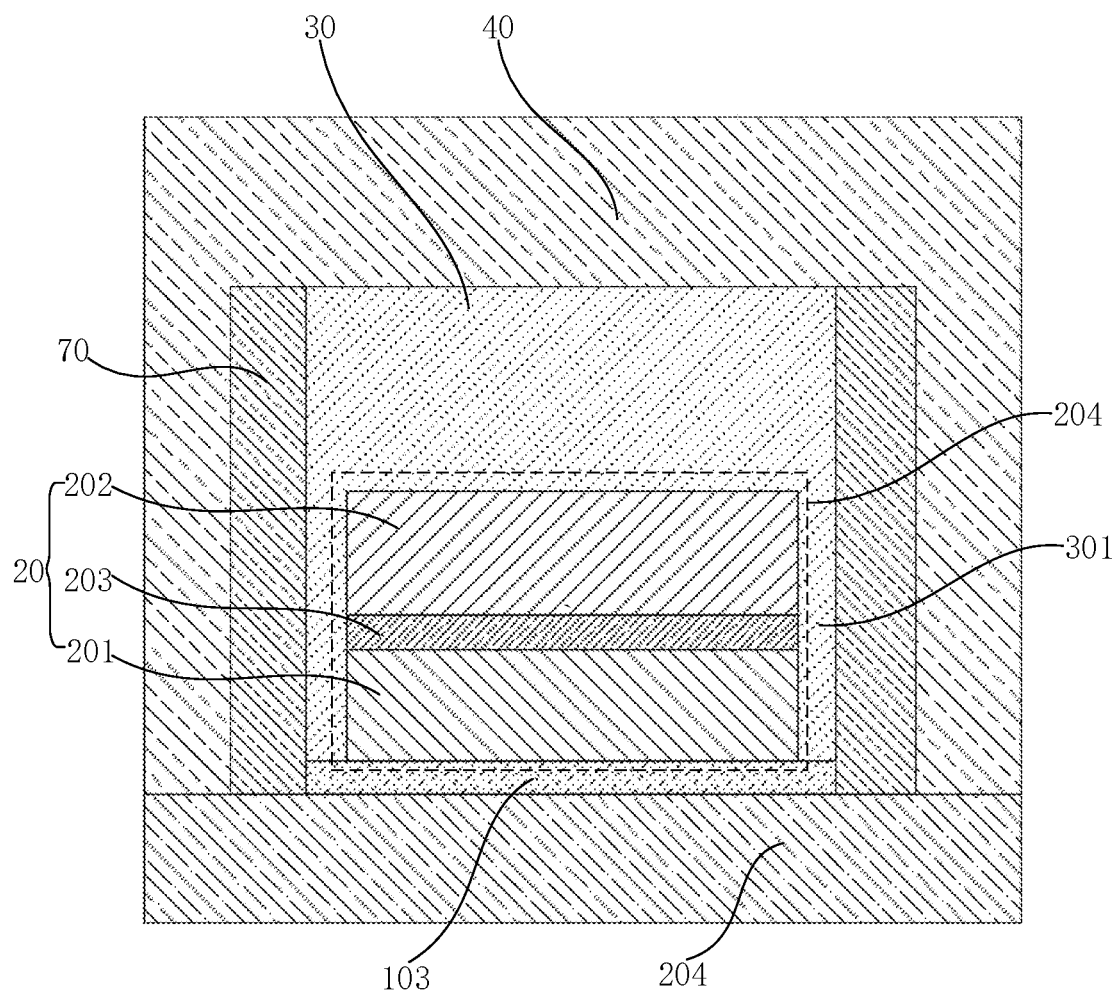
FIG. 3 is a sectional view in a B-B direction in FIG. 1.
Figure 4:
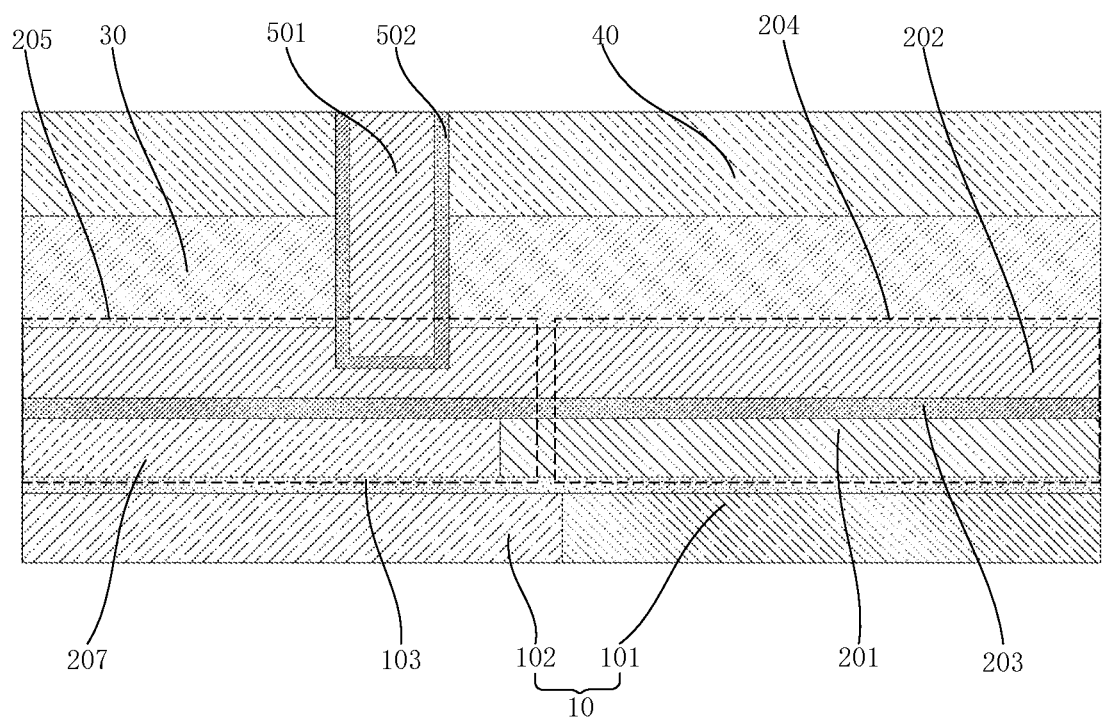
FIG. 4 is a sectional view in a C-C direction in FIG. 1.

10: Substrate;
20: Conductive layer;

30: Gate insulating layer;
40: Insulating covering layer;
50: Wire connection part;
60: Mask layer;
70: Side wall insulating layer;
101: Semiconductor substrate;
102: Insulating substrate;
103: Gate dielectric layer;
201: First conductive layer;
202: Second conductive layer;
203: Third conductive layer;
204: Gate conductor layer;
205: External connecting layer;
206: Groove;
207: Insulator;
208: Insulating filler;
301: Insulating side wall;
401: Channel;
501: First wire connection part;
502: Second wire connection part; and
601: Etching hole.

DETAILED DESCRIPTION

In order to make the objectives, technical solutions, and advantages of the embodiments of the present disclosure clearer, the technical solutions in the embodiments of the present disclosure will be described clearly and completely in combination with the drawings in the embodiments of the present disclosure. It is apparent that the described embodiments are part of, but not all of, the embodiments of the present disclosure. Based on the embodiments in the present disclosure, all other embodiments obtained by those of ordinary skill in the art without creative efforts shall fall within the protection scope of the present disclosure.

Dynamic Random Access Memory (DRAM) includes a plurality of repeated storage units. Each storage unit includes a capacitor structure and a transistor structure. The transistor structure has a gate connected to a word line, a drain connected to a bit line and a source connected to the capacitor structure. A voltage signal on the word line may control turn-on or turn-off of a transistor, and then read, through the bit line, data stored in the capacitor structure, or write, through the bit line, the data into the capacitor structure.

A typical semiconductor structure includes a substrate, a gate dielectric layer, a first conductive layer, a second conductive layer, a third conductive layer and a gate insulating layer that are stacked in sequence. The second conductive layer is bonded to the first conductive layer and to the third conductive layer to form a conductor layer. The substrate includes a semiconductor substrate and an insulating substrate which are arranged on the same layer. The conductor layer includes a gate conductor layer, a projection of which on the substrate covers the semiconductor substrate, and an external connecting layer, a projection of which on the substrate covers the insulating substrate. A gate conductor layer, the gate dielectric layer and the semiconductor substrate form the transistor structure. The external connecting layer is configured to form a connecting part that is configured to be connected to an external device.

However, a distance between the external connecting layer and the gate conductor layer or a distance between the external connecting layer and other conductive film layers is smaller because of smaller volume of the semiconductor structure. The properties of the semiconductor structure are affected as electric leakage is liable to occur between the external connecting layer and the gate conductor layer or between the external connecting layer and other conductive film layers.

More specifically, in a semiconductor structure that includes a substrate, a gate dielectric layer, a first conductive layer, a second conductive layer, a third conductive layer and a gate insulating layer that are stacked in sequence, the second conductive layer is located between the first conductive layer and the third conductive layer, and is bonded to the first conductive layer and to the third conductive layer. In such a manner, the first conductive layer, the second conductive layer and the third conductive layer form a conductor layer. The substrate includes a semiconductor substrate and an insulating substrate which are arranged on the same layer. The conductor layer includes a gate conductor, a projection of which on the substrate covers the semiconductor substrate, and an external connecting layer, a projection of which on the substrate covers the insulating substrate. A gate conductor layer, the gate dielectric layer and the semiconductor substrate form the transistor structure. The transistor structure may be connected to the capacitor structure to realize storage or reading of data. The external connecting layer is configured to form a connecting part that is configured to be connected to an external device, thereby realizing functions such as on-off switch, signal conduction and test.

However, with the gradual development of semiconductor manufacturing techniques, a distance between the external connecting layer and the gate conductor layer or a distance between the external connecting layer and other conductive film layers is smaller because of smaller volume of the semiconductor structure. The properties of the semiconductor structure are affected as electric leakage is liable to occur between the external connecting layer and the gate conductor layer or between the external connecting layer and other conductive film layers.

According to a semiconductor structure provided in the embodiment, a groove is formed in a side, close to an insulating substrate, of a conductor layer corresponding to the insulating substrate. The groove is filled with an insulator to reduce a volume of the conductor layer corresponding to the insulating substrate. In such a manner, electric leakage between the conductor layer corresponding to the insulating substrate and other film layers is avoided, so that the properties of the semiconductor structure are improved.

The semiconductor structure is not limited in the embodiment. The semiconductor structure will be described below by taking the DRAM as an example, and of course, the semiconductor structure in the embodiment further may be other structures.

Referring to FIG. 1 to FIG. 4, in the embodiment, the semiconductor structure includes a substrate 10, a gate dielectric layer 103 and a conductive layer 20 that are stacked, herein, the gate dielectric layer 103 is located between the conductive layer 20 and the substrate 10. The substrate 10 includes a semiconductor substrate 101 and an insulating substrate 102 which are arranged on the same layer. The semiconductor substrate 101 and the insulating substrate 102 together form the plate-shaped substrate 10 as the basis of the semiconductor structure.

Illustratively, materials of the semiconductor substrate 101 may include silicon, germanium and the like. Materials of the insulating substrate 102 may include insulating materials such as silicon nitride and silicon oxide. Materials of the gate dielectric layer 103 may include oxides (such as silicon oxide) and the like.

Materials of the conductive layer 20 may include conductive materials such as tungsten, aluminum, tungsten silicide (WxSiy) and polycrystalline silicon. The conductive layer 20 includes a gate conductor layer 204, a projection of which on the substrate 10 covers the semiconductor substrate 101. The gate conductor layer 204, the gate dielectric layer 103 and the semiconductor substrate 101 together form a transistor structure. The transistor structure may be electrically connected to a capacitor structure, so that data in the capacitor structure is read through the transistor structure, or data is written into the capacitor structure through the transistor structure. In such a manner, storage of the data is realized.

The conductive layer 20 further includes an external connecting layer 205, a projection of which on the substrate 10 covers the insulating substrate 102. The external connecting layer 205 is provided with a certain pattern to form a circuit. The external connecting layer 205 may be configured to be connected to an external device to realize functions such as test and signal transmission. Of course, the external connecting layer 205 also may form a switch device to realize an on-off switch function. The external connecting layer 205 is not limited in the embodiment.

Further referring to FIG. 1 to FIG. 4, a groove is formed on a bottom surface, towards the insulating substrate 102, of the external connecting layer 205. Herein, the groove is filled with an insulator 207. In such a manner, a volume of the conductive layer 20 (the external connecting layer 205) corresponding to the insulating substrate 102 may be reduced, so that electric leakage between the conductive layer 20 corresponding to the insulating substrate 102 and other film layers is avoided, and therefore the properties of the semiconductor structure are improved.

In the embodiment, the groove may be located on the whole bottom surface of the external connecting layer 205. The groove may be located on part of the bottom surface of the external connecting layer 205. In an implementation that the groove is located on part of the bottom surface of the external connecting layer 205, there may be a plurality of grooves, and the plurality of grooves are formed on the bottom surface of the external connecting layer 205 at intervals.

In the implementation, the groove is filled with the insulator 207. Materials of the insulator 207 may include insulating materials such as silicon nitride, silicon oxide and nitride oxide silicon. Materials of the insulators 207 are not limited in the embodiment.

According to the semiconductor structure provided in the embodiment, a gate dielectric layer 103 is arranged between a substrate 10 and a conductive layer 20, the substrate 10 includes a semiconductor substrate 101 and an insulating substrate 102 which are arranged on the same layer. The conductive layer 20 includes a gate conductor layer 204, a projection of which covers the semiconductor substrate 101 on the substrate 10, and an external connecting layer 205, a projection of which covers the insulating substrate 102 on the substrate 10. The gate conductor layer 204, the gate dielectric layer 103 and the semiconductor substrate 101 together form a transistor structure. A groove, which is filled with an insulator 207, is formed on a bottom surface, towards the substrate 10, of the external connecting layer 205. A volume of the external connecting layer 205 may be reduced through the insulator 207 arranged in the groove, so that electric leakage between the external connecting layer 205 and other conductive film layers is avoided, and therefore the properties of the semiconductor structure are improved.

Further referring to FIG. 1 to FIG. 4, in the embodiment, the conductive layer 20 includes a first conductive layer 201 and a second conductive layer 202 that are stacked. The first conductive layer 201 is arranged to be close to the substrate 10 and the groove is formed on a bottom surface, towards the substrate 10, of the first conductive layer 201. A volume of the conductive layer 20 composed of the first conductive layer 201 and the second conductive layer 202 may be reduced by forming the groove on the first conductive layer 201. In such a manner, a volume of the external connecting layer 205 is reduced, so that electric leakage between the external connecting layer and other film layers is avoided.

In some implementations, the groove formed on the bottom surface of the first conductive layer 201 does not penetrate through the first conductive layer 201, that is, the groove bottom of the groove is located within the first conductive layer 201.

In some implementations, the groove formed on the first conductive layer 201 penetrates through the first conductive layer 201, that is, the groove is of a pore structure which penetrates through the first conductive layer 201 in a direction perpendicular to the substrate 10. In such a manner, a volume of the external connecting layer 205 may be further reduced, so as to further avoid electric leakage between the external connecting layer 205 and other film layers, and thereby improving the properties of the semiconductor structure.

Illustratively, materials of the first conductive layer 201 include tungsten, aluminum, polycrystalline silicon and the like. Materials of the second conductive layer 202 include tungsten, aluminum, tungsten silicide, polycrystalline silicon and the like.

In the embodiment, a part of the first conductive layer 201, a projection of which on the substrate 10 covers the semiconductor substrate 101 and a part of the first conductive layer 201, a projection of which on the substrate 10 covers the insulating substrate 102 may be formed through the same process step. That is, a part of the first conductive layer 201 corresponding to the gate conductor layer 204 and a part of the first conductive layer 201 corresponding to the external connecting layer 205 are formed through a same process step. For example, the process step may be evaporation plating or electroplating and the like. In such a manner, the manufacturing difficulty of the semiconductor structure may be reduced.

Similarly, a part of the second conductive layer 202, a projection of which on the substrate 10 covers the semiconductor substrate 101 and a part of the second conductive layer 202, a projection of which on the substrate 10 covers the insulating substrate 102 may be formed through the same process step. That is, a part of the second conductive layer 202 corresponding to the gate conductor layer 204 and a part of the second conductive layer 202 corresponding to the external connecting layer 205 are formed through the same process step. For example, the process step may be evaporation plating or electroplating and the like.

Further referring to FIG. 1 to FIG. 4, in the embodiment, the conductive layer 20 further includes a third conductive layer 203 located between the first conductive layer 201 and the second conductive layer 202. The third conductive layer 203 is bonded to the first conductive layer 201 and to the second conductive layer 202, so that the first conductive layer 201 is connected to the second conductive layer 202 through the third conductive layer 203. Materials of the conductive layer 203 may include tungsten, titanium, polycrystalline silicon, and the like.

In the implementation that the groove penetrates through the first conductive layer 201, the groove only penetrates through the first conductive layer 201, that is, the groove does not extend to the third conductive layer 203. Certainly, the groove also may extend towards the third conductive layer 203 after penetrating through the first conductive layer 201, and the groove bottom of the groove may be located within the third conductive layer 203; or the groove penetrates through the third conductive layer 203, so that the groove bottom of the groove is located within the second conductive layer 202. In such a manner, a volume of the external connecting layer 205 is further reduced, electric leakage between the external connecting layer 205 and other film layers is further avoided, and therefore the properties of the semiconductor structure are further improved.

Further referring to FIG. 1 to FIG. 4, the semiconductor structure provided in the embodiment further includes a gate insulating layer 30. The gate insulating layer 30 covers a side, away from the substrate 10, of the conductive layer 20, and the gate insulating layer 30 has insulating side walls 301 each extending to a respective one of side walls, perpendicular to the substrate 10, of the conductive layer 20. The gate insulating layer 30 covers a top surface of the conductive layer 20 away from the substrate 10 and a side wall between the top surface and the bottom surface of the conductive layer 20. In such a manner, the conductive layer 20 is isolated. Illustratively, materials of the gate dielectric layer 30 may include silicon oxide, silicon nitride and the like.

In some embodiments, a side wall opening which communicates with the groove is formed on an insulating side wall 301 corresponding to the external connecting layer 205. In such a manner, a part of the conductive layer 20 corresponding to the groove may be removed through the side wall opening, so that the groove is conveniently formed; after the groove is formed, the insulator 207 is filled into the groove through the side wall opening, so that the insulator 207 is conveniently manufactured. In such a manner, the manufacturing difficulty of the semiconductor structure is reduced.

Further referring to FIG. 1 to FIG. 4, the semiconductor structure further includes a side wall insulating layer 70 fitted to the insulating side walls 301 of the gate insulating layer 30. The side wall insulating layer 70 may protect the gate insulating layer 30. Illustratively, materials of the side wall insulating layer 70 may include silicon oxide, silicon nitride and the like.

In the implementation, the semiconductor structure further includes an insulating covering layer 40 which covers the gate insulating layer 30 and the substrate 10. The insulating covering layer may protect the gate insulating layer 30 and the substrate 10, so that an external object is prevented from being in contact with the gate insulating layer 30 and the substrate 10. In addition, air may further be prevented from being in contact with the gate insulating layer 30, the gate dielectric layer 103 and the substrate 10, so as to improve the properties of the semiconductor device. Illustratively, materials of the insulating covering layer 40 may include silicon oxide, silicon nitride and the like.

In some embodiments, a channel 401 which extends to the gate dielectric layer 103 and communicates with the side wall opening is arranged on the insulating covering layer 40. The channel 401 is filled up an insulating filler 208. Through the channel 401 and the side wall opening, the remove of conductive layer 20 corresponding to the groove and filling of the insulator 207 into the groove may be realized, so that the manufacturing difficulty of the semiconductor structure is simplified. After the insulator 207 is formed, the channel 401 may be filled with the insulating filler 208.

In the embodiment, the insulating filler 208 is integral with the insulator 207. That is, the insulating filler 208 and the insulator 207 are the same in material and are formed through the same process step. In such a manner, the manufacturing difficulty of the semiconductor structure further may be reduced. Of course, in other implementations, the insulating filler 208 and the insulator 207 are different in material, and are formed through different process steps, which is not limited in the embodiment.

Further referring to FIG. 1 to FIG. 4, the semiconductor structure provided in the embodiment further includes a wire connection part 50. An end of the wire connection part 50 is connected to a side, away from the substrate 10, of the external connecting layer 205, and the other end of the wire connection part 50 extends in a direction away from the substrate 10. The wire connection part 50 is configured to connect to an external device. In such a manner, the external connecting layer 205 may be connected to the external device through the wire connection part 50, so as to realize functions such as signal transmission and detection.

Illustratively, the wire connection part 50 may be cylindrical, and may be in contact with the second conductive layer 202 after passing through the insulating covering layer 40 and the gate insulating layer 30. To reduce resistance between the wire connection part 50 and the second conductive layer 202, a pit may be formed on a top surface, away from the substrate 10, of the second conductive layer 202. A part of the wire connection part 50 is contained in the pit.

The wire connection part 50 may include a first wire connection part 501 and a second wire connection part 502 covering the first wire connection part 501. Materials of the first conductive layer 501 may include tungsten, aluminum, tungsten silicide, polycrystalline silicon and the like. Materials of the second conductive layer 502 may include tungsten, aluminum, and the like.

The embodiment further provides a method for manufacturing a semiconductor structure. The method is used for manufacturing the semiconductor structure provided in each embodiment above. In the semiconductor structure manufactured by the method, a gate dielectric layer is arranged between a substrate and a conductive layer, the substrate includes a semiconductor substrate and an insulating substrate which are arranged on the same layer. The conductive layer includes: a gate conductor layer, a projection of which on the substrate covers the semiconductor substrate, and an external connecting layer, a projection of which on the substrate covers the insulating substrate. The gate conductor layer, the gate dielectric layer and the semiconductor substrate together form the transistor structure. A groove, which is filled with an insulator, is formed on the bottom surface, towards the substrate, of the external connecting layer. A volume of the external connecting layer may be reduced through the insulator arranged in the groove, so that electric leakage between the external connecting layer and other conductive film layers is avoided, and therefore the properties of the semiconductor structure are improved.

Figure 5:
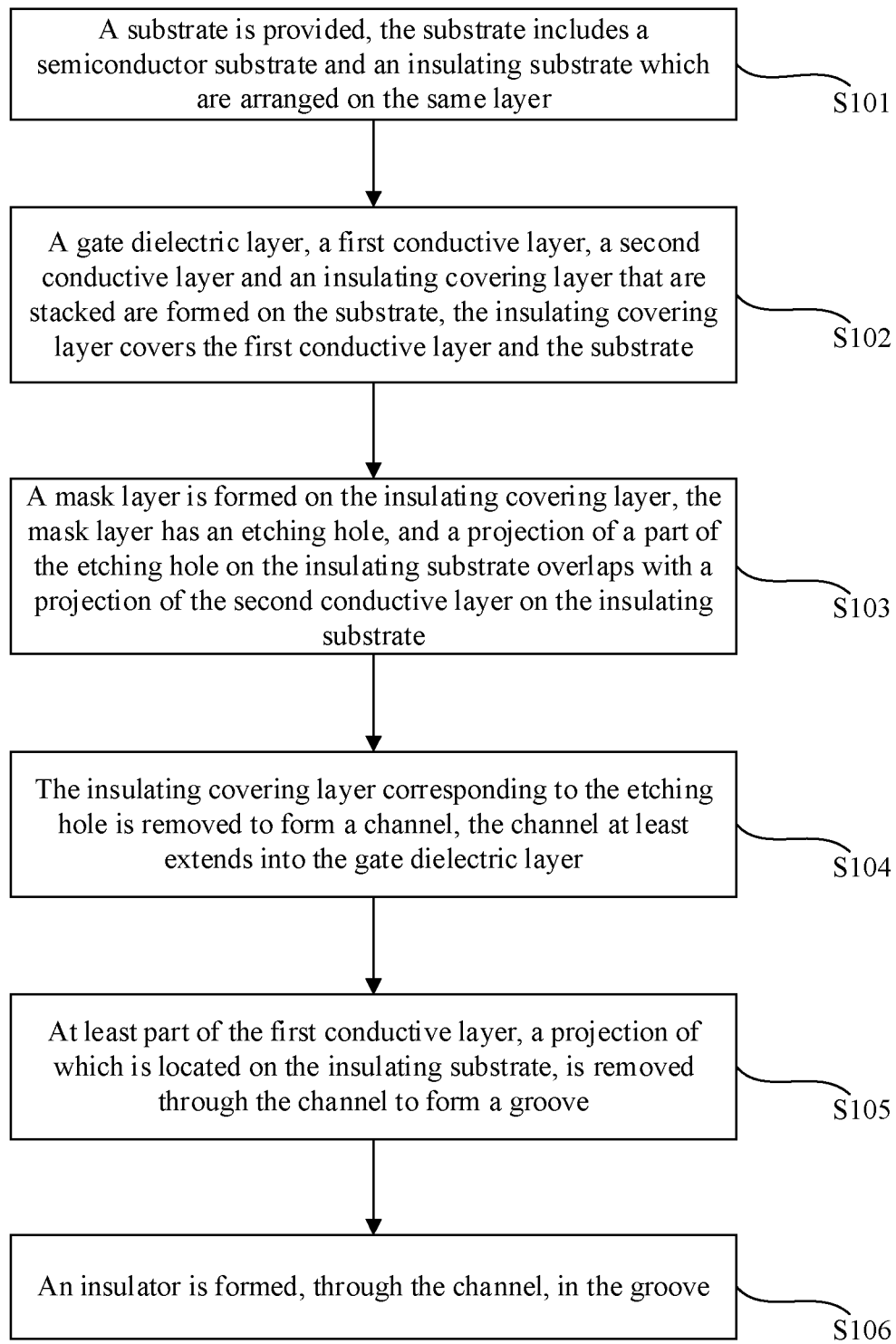
FIG. 5 is flowchart showing a method for manufacturing a semiconductor structure provided in an embodiment of the present disclosure.
Figure 6:
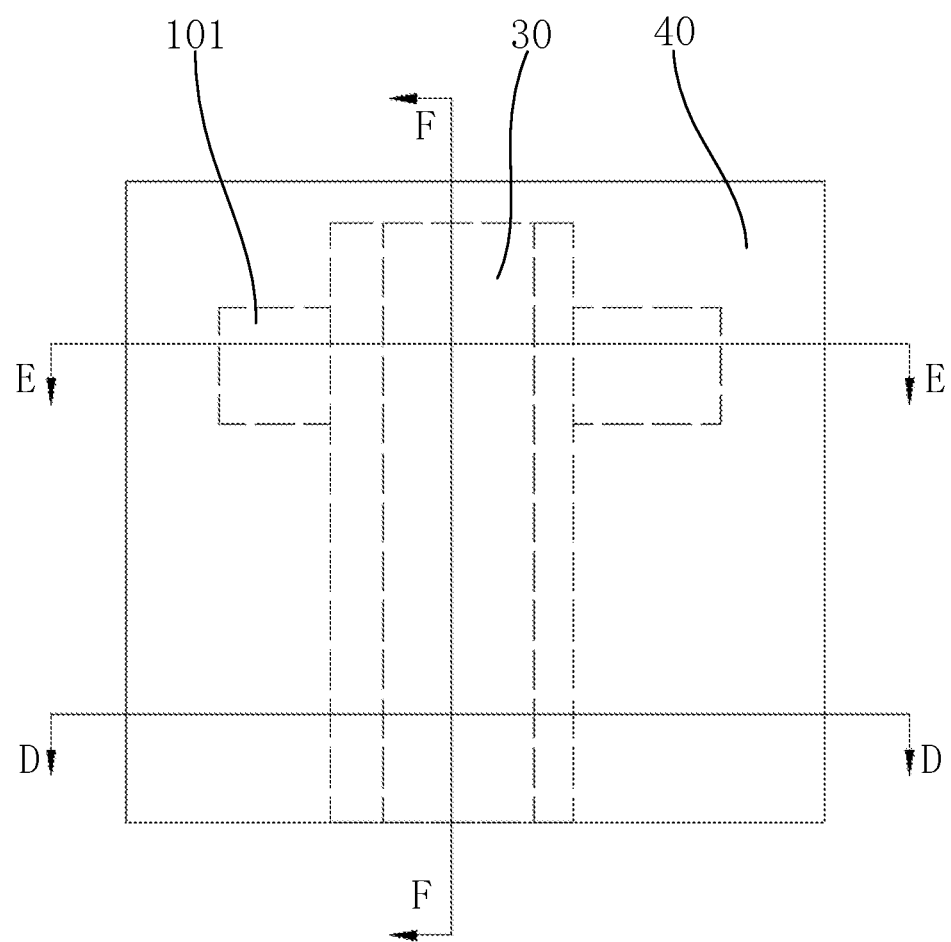
FIG. 6 is a structural schematic diagram after an insulating covering layer is formed in a method for manufacturing a semiconductor structure provided in an embodiment of the present disclosure.
Figure 7:
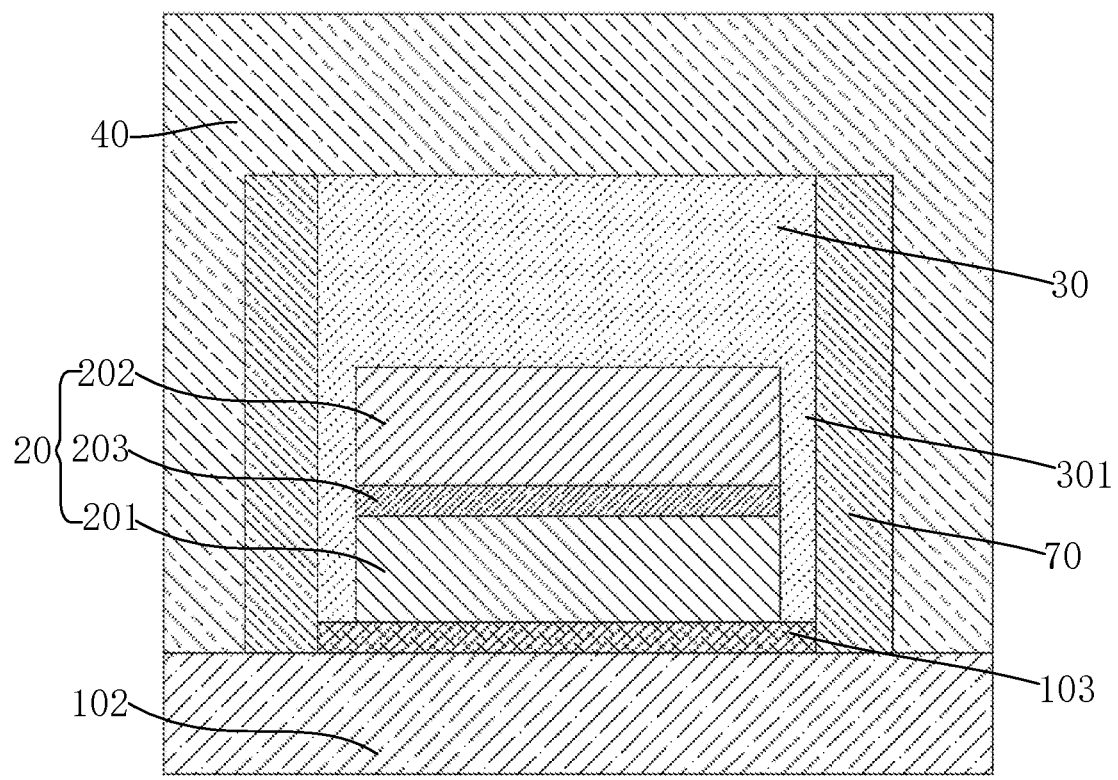
FIG. 7 is a sectional view in a D-D direction in FIG. 6.
Figure 8:
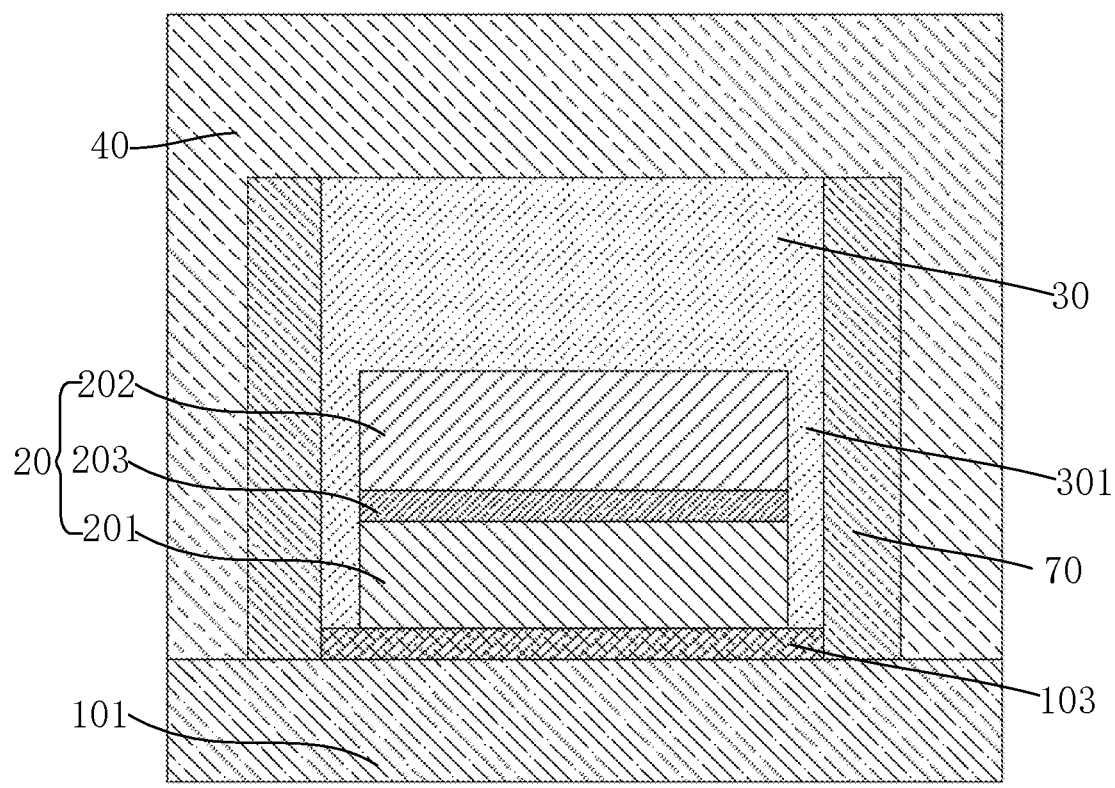
FIG. 8 is a sectional view in an E-E direction in FIG. 6.
Figure 9:
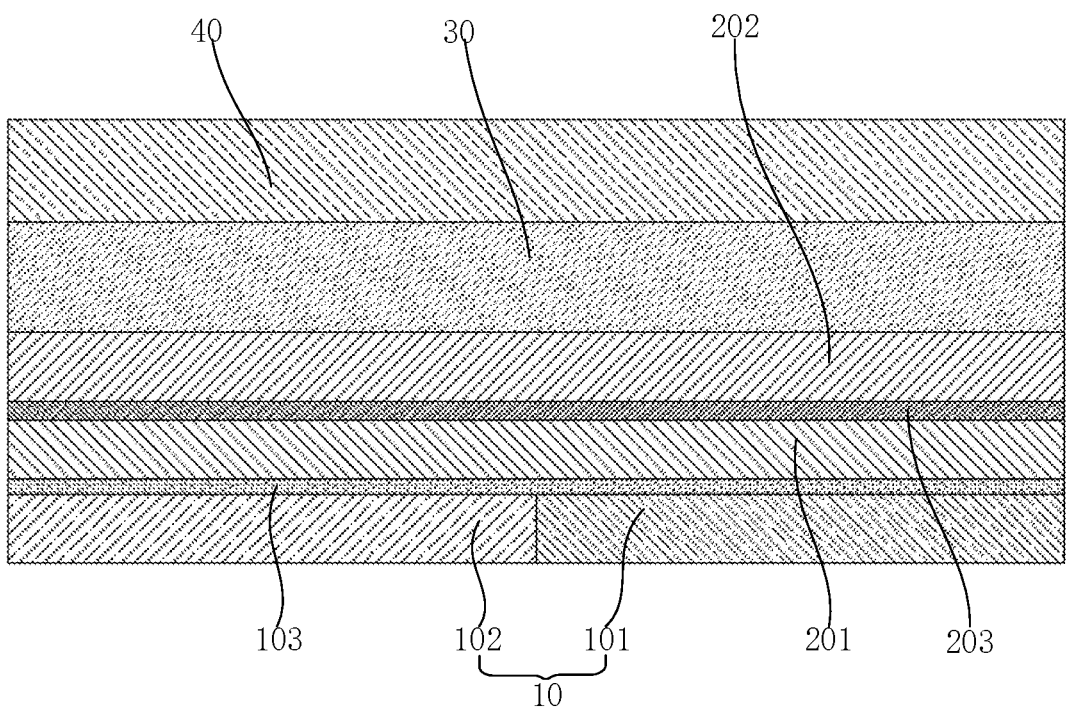
FIG. 9 is a sectional view in an F-F direction in FIG. 6.
Figure 10:
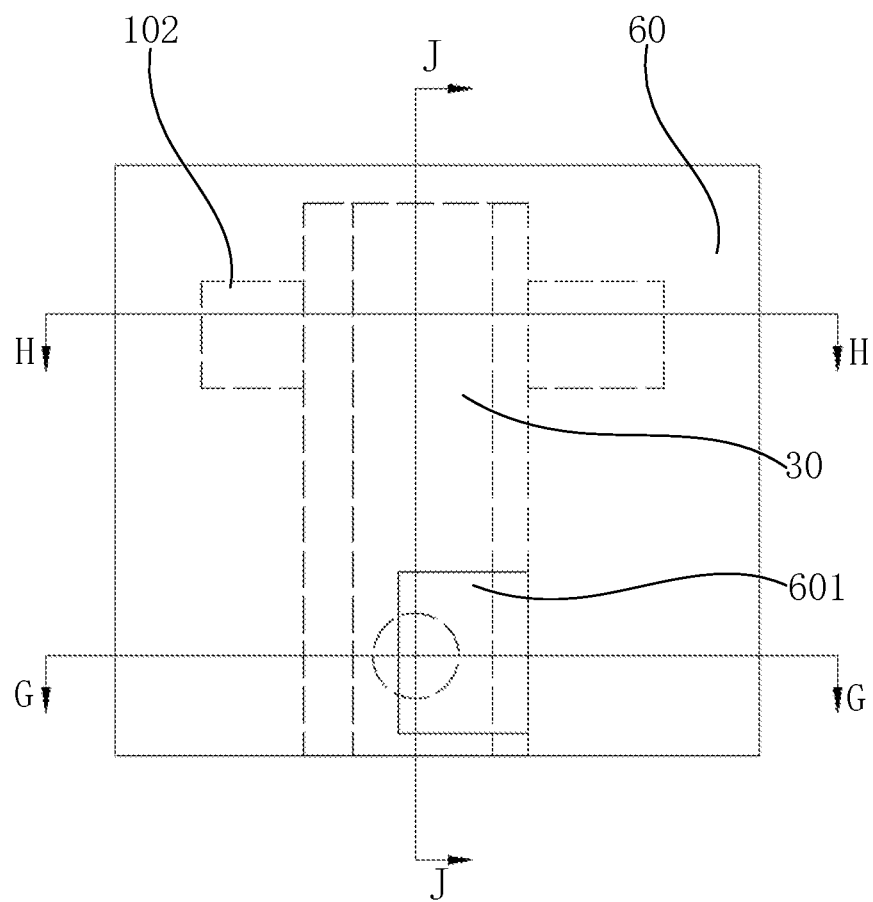
FIG. 10 is a structural schematic diagram after a mask layer is formed in a method for manufacturing a semiconductor structure provided in an embodiment of the present disclosure.
Figure 11:
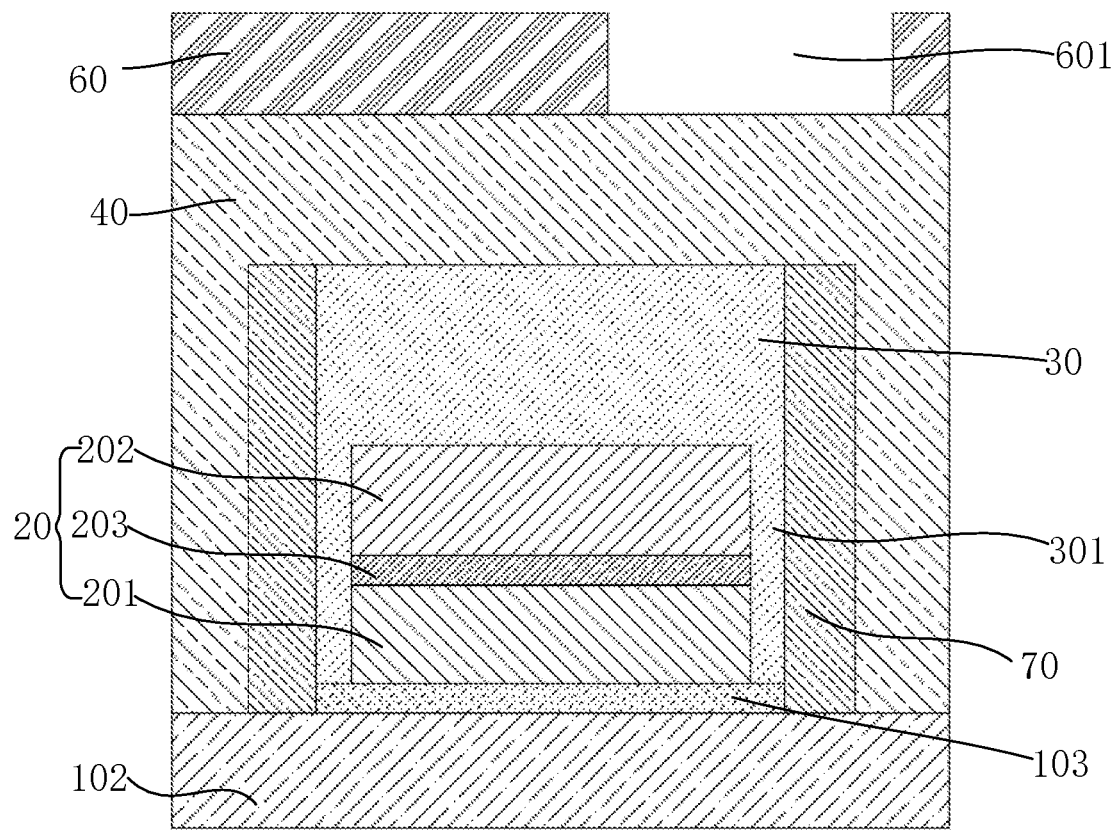
FIG. 11 is a sectional view in a G-G direction in FIG. 10.
Figure 12:
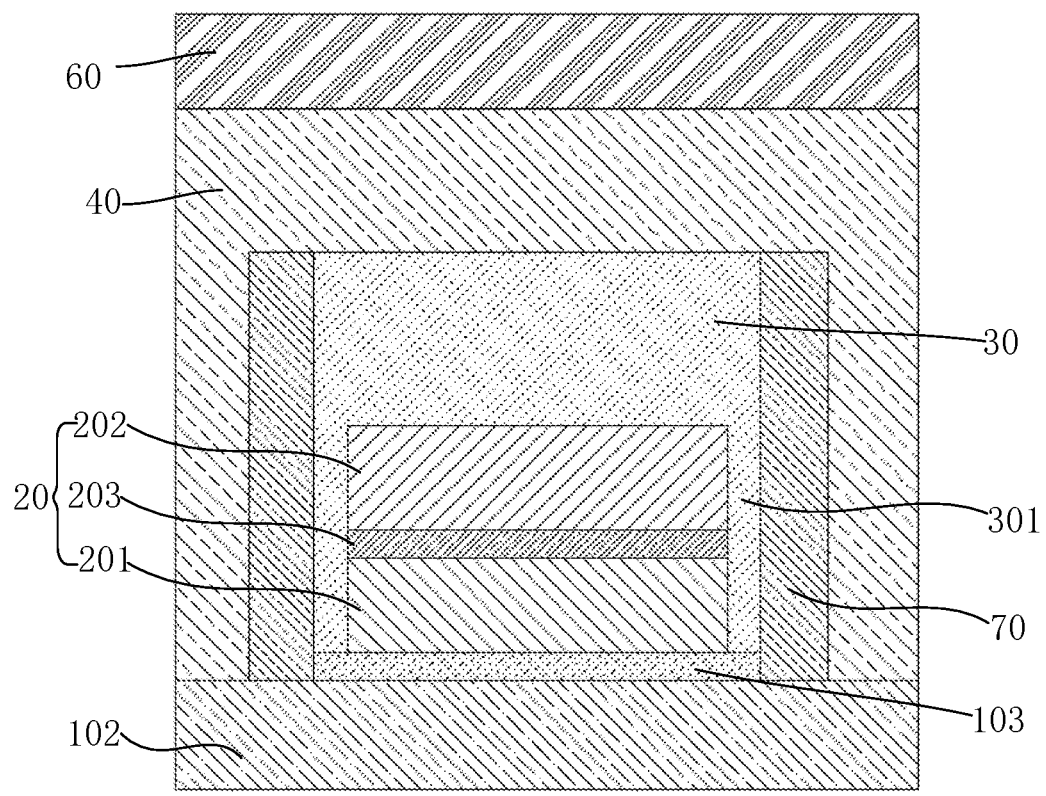
FIG. 12 is a sectional view in an H-H direction in FIG. 10.
Figure 13:
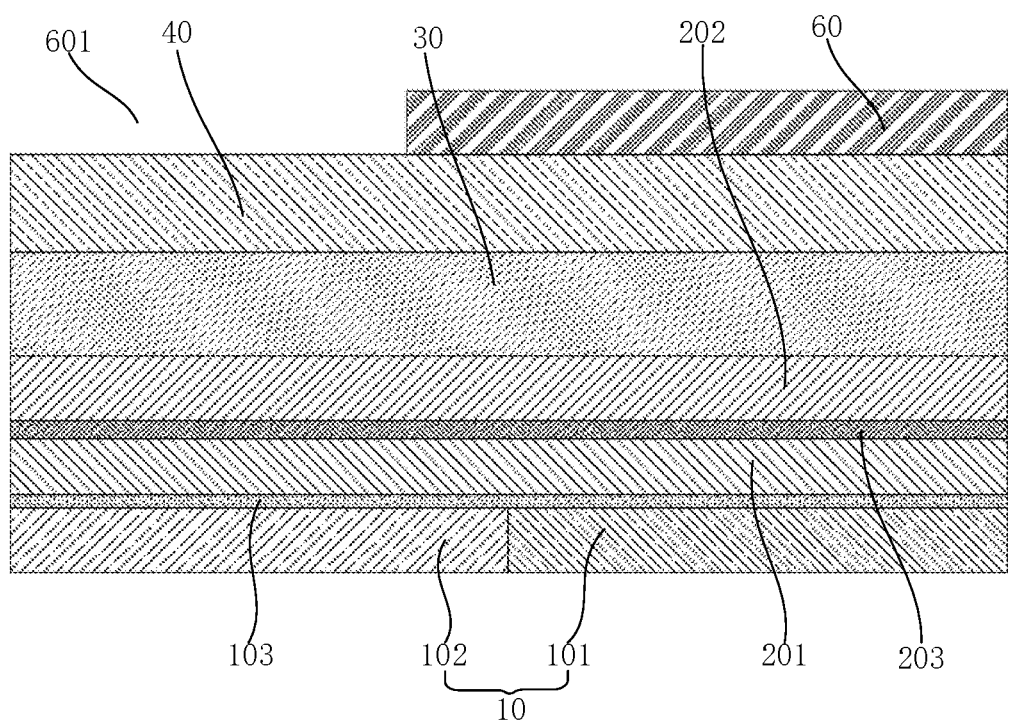
FIG. 13 is a sectional view in a J-J direction in FIG. 10.

As shown in FIG. 5, the method for manufacturing the semiconductor structure includes the following operations.

At S101, a substrate is provided, herein, the substrate includes a semiconductor substrate and an insulating substrate which are arranged on the same layer.

Further referring to FIG. 6 to FIG. 9, illustratively, materials of the semiconductor substrate 101 may include silicon, germanium and the like. Materials of the insulating substrate 102 may include insulating materials such as silicon nitride and silicon oxide.

Further referring to FIG. 5, after the substrate 10 is formed, the method further includes the following operations.

At S102, a gate dielectric layer, a first conductive layer, a second conductive layer and an insulating covering layer that are stacked are formed on the substrate, herein, the insulating covering layer covers the second conductive layer and the substrate.

Illustratively, materials of the gate dielectric layer 103 may include oxides (such as silicon oxide). Materials of the first conductive layer 201 may include tungsten, aluminum polycrystalline silicon and the like. Materials of the second conductive layer 202 may include tungsten, aluminum, tungsten silicide, polycrystalline silicon and the like. Materials of the insulating covering layer 40 may include silicon oxide, silicon nitride and the like.

The first conductive layer 201 and the second conductive layer 202 are stacked. The first conductive layer 201 and the second conductive layer 202 are connected, so that the first conductive layer 201 and the second conductive layer 202 together form a conductive layer 20. The conductive layer 20 includes a gate conductor layer 204, a projection of which on the substrate 10 covers the semiconductor substrate 101, and an external connecting layer 205, a projection of which on the substrate 10 covers the insulating substrate 102. The gate conductor layer 204, the gate dielectric layer 103 and the semiconductor substrate 101 together form the transistor structure. The transistor structure may be electrically connected to the capacitor structure, so that data in the capacitor structure is read through the transistor structure, or data is written into the capacitor structure through the transistor structure. In such a manner, storage of the data is realized.

The insulating covering layer 40 may protect the gate insulating layer 30, the first conductive layer 201, the second conductive layer 202 and the substrate 10, so that an external object is prevented from being in contact with the gate insulating layer 30 and the substrate 10. In addition, air further may be prevented from being in contact with the gate insulating layer 30, the gate dielectric layer 103 and the substrate 10, so as to improve the properties of a semiconductor device.

Further referring to FIG. 5, and FIG. 9 to FIG. 13, after the insulating covering layer 40 is formed, the method further includes the following operation.

At S103, a mask layer is formed on the insulating covering layer, herein, the mask layer has an etching hole thereon, herein, a projection of a part of the etching hole on the insulating substrate overlaps with a projection of the second conductive layer on the insulating substrate.

Figure 14:
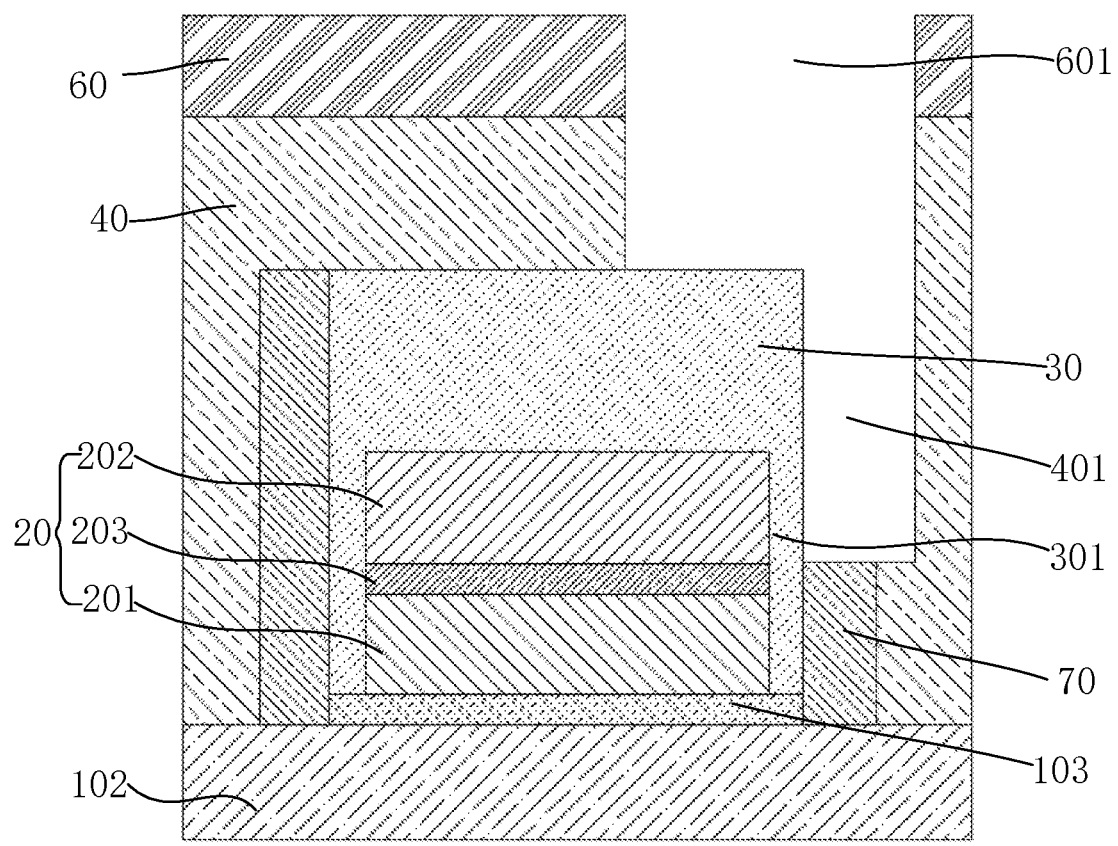
FIG. 14 is a structural schematic diagram after a channel is formed in a method for manufacturing a semiconductor structure provided in an embodiment of the present disclosure.
Figure 15:
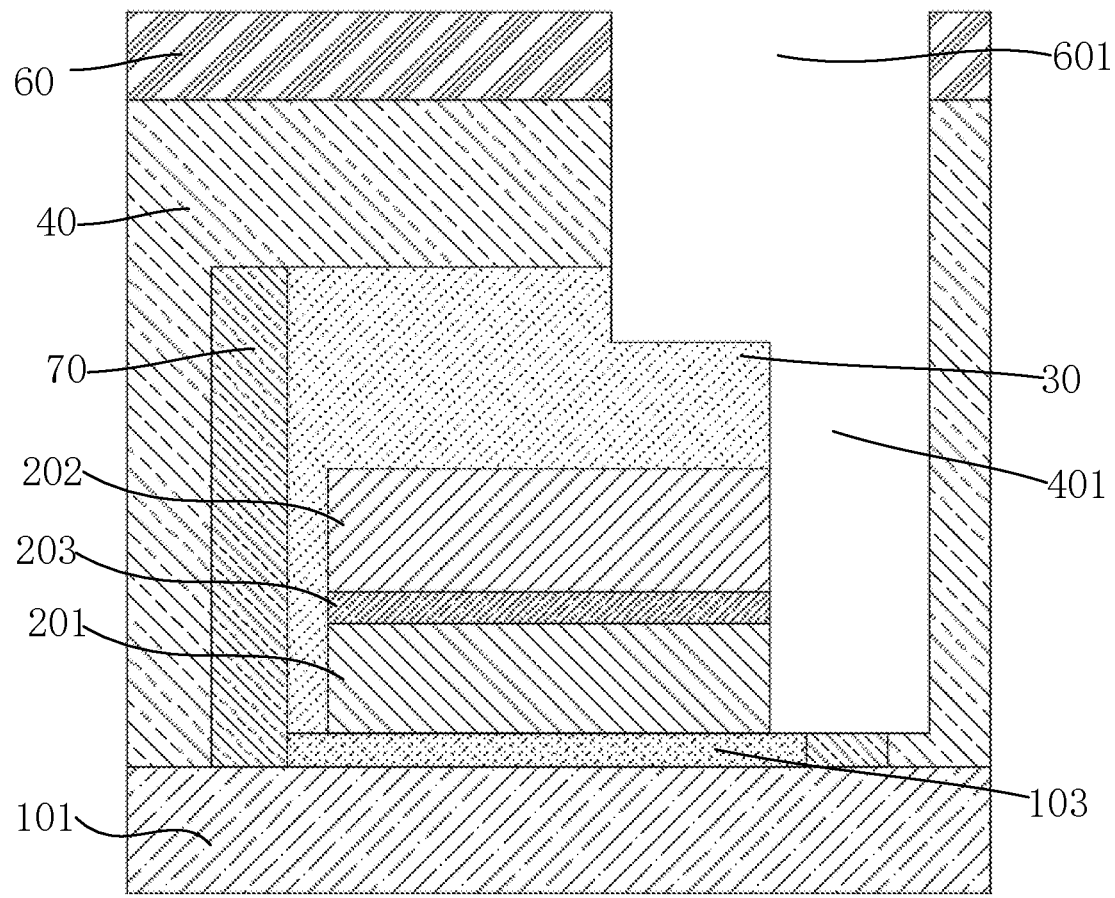
FIG. 15 is a structural schematic diagram after an insulating side wall is removed in a method for manufacturing a semiconductor structure provided in an embodiment of the present disclosure.

Further referring to FIG. 5, FIG. 14 to FIG. 15, after the mask layer 60 is formed, the method further includes the following operation.

At S104, the insulating covering layer corresponding to the etching hole is removed to form a channel, herein, the channel at least extends into the gate dielectric layer.

Illustratively, the insulating covering layer 40 corresponding to the etching holes 601 may be removed through dry etching or wet etching. In such a manner, a channel 401 extending to the substrate 10 is formed.

Figure 16:
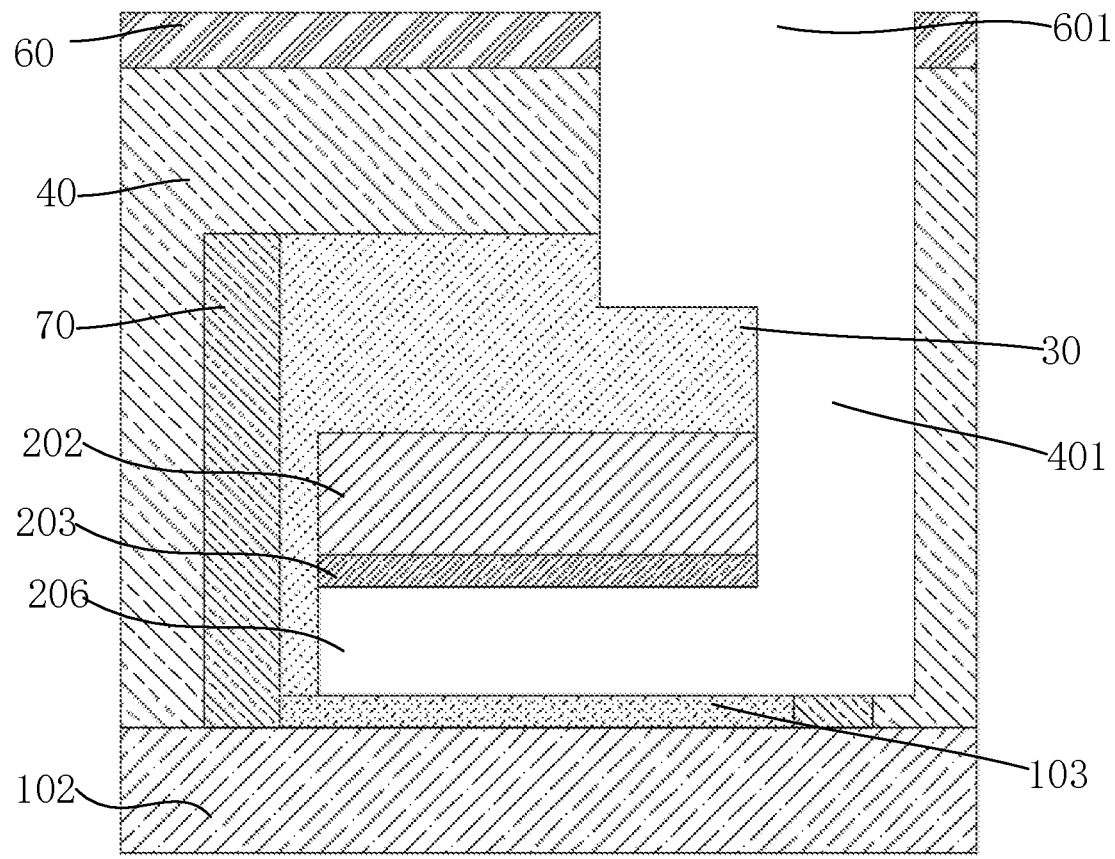
FIG. 16 is a structural schematic diagram after a groove is formed in a method for manufacturing a semiconductor structure provided in an embodiment of the present disclosure.
Figure 17:
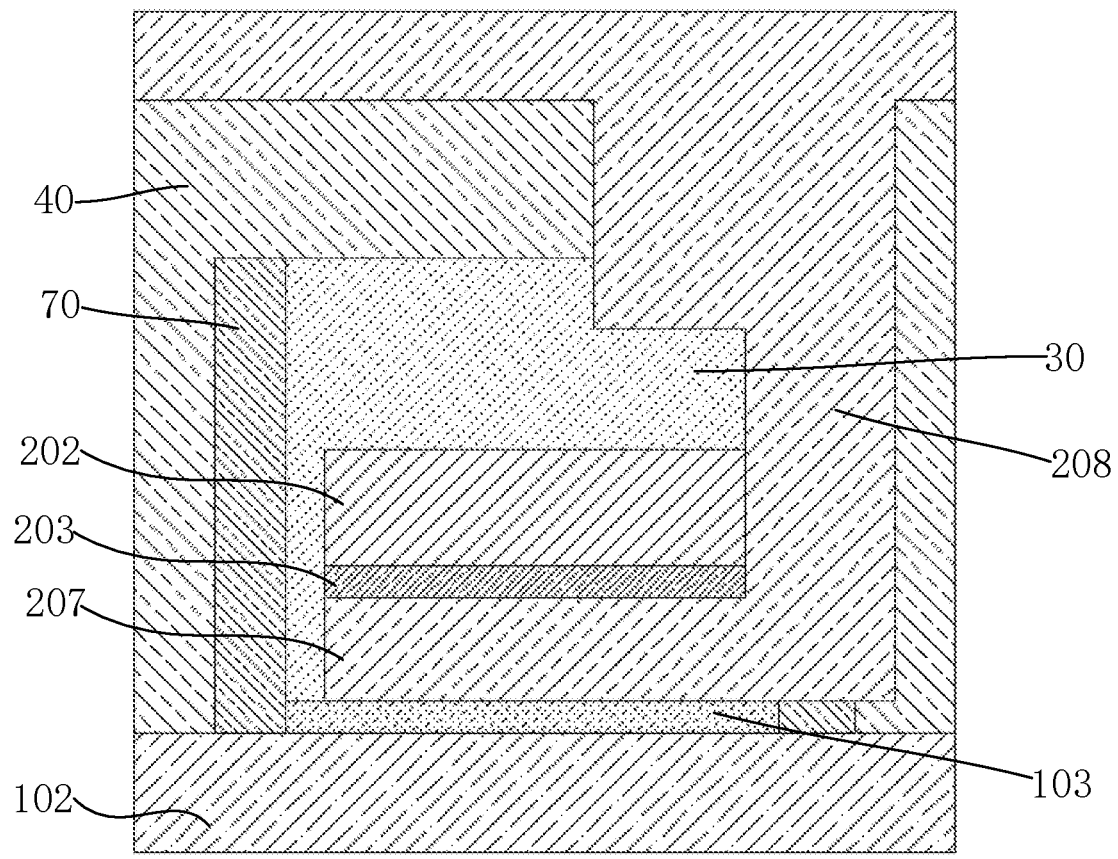
FIG. 17 is a structural schematic diagram after an insulator is formed in a method for manufacturing a semiconductor structure provided in an embodiment of the present disclosure.
Figure 18:
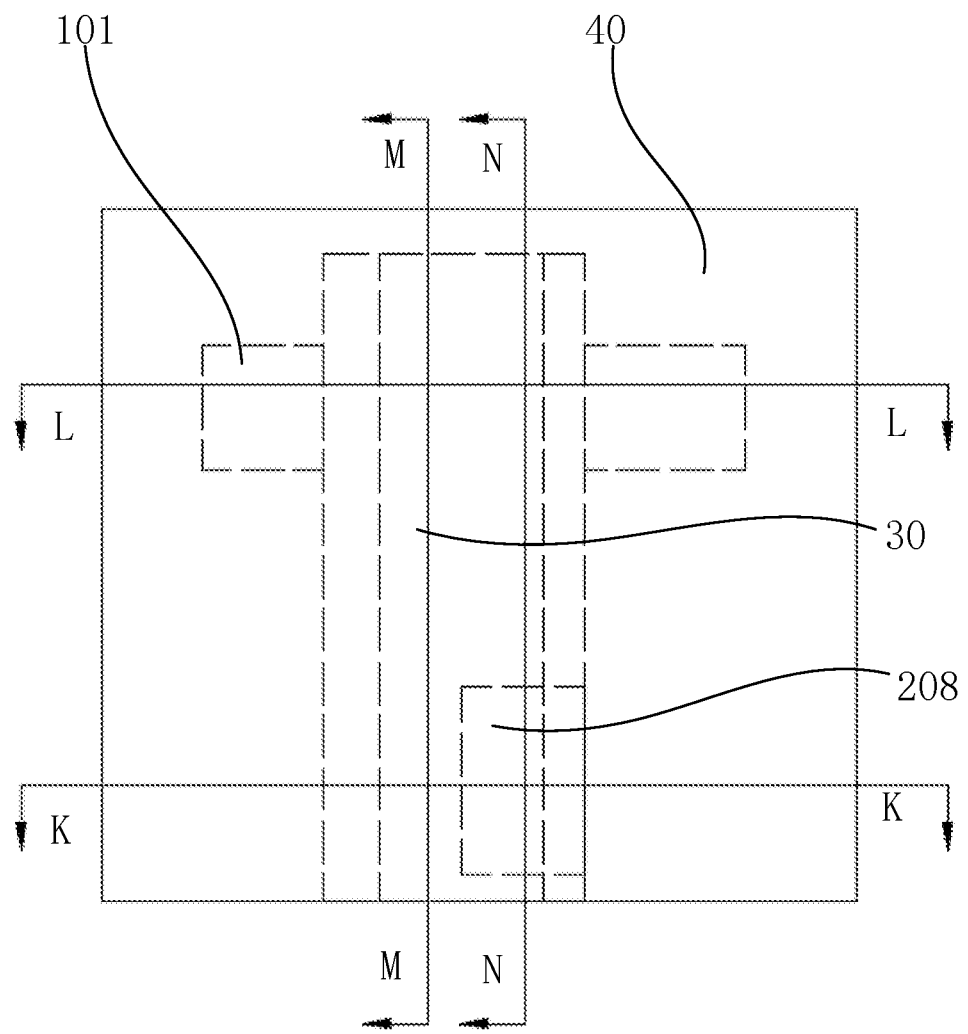
FIG. 18 is a top view after an insulator is formed in a method for manufacturing a semiconductor structure provided in an embodiment of the present disclosure.
Figure 19:
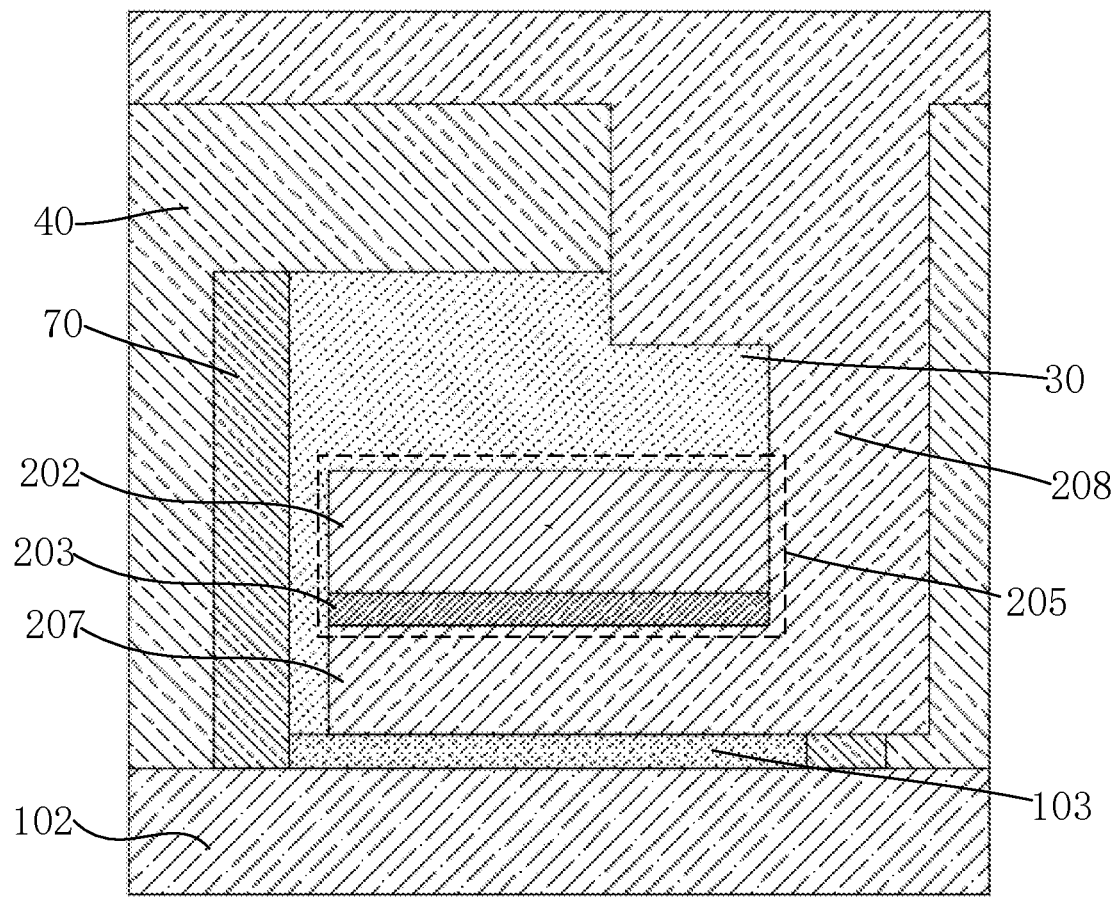
FIG. 19 is a sectional view in a K-K direction in FIG. 18.
Figure 20:
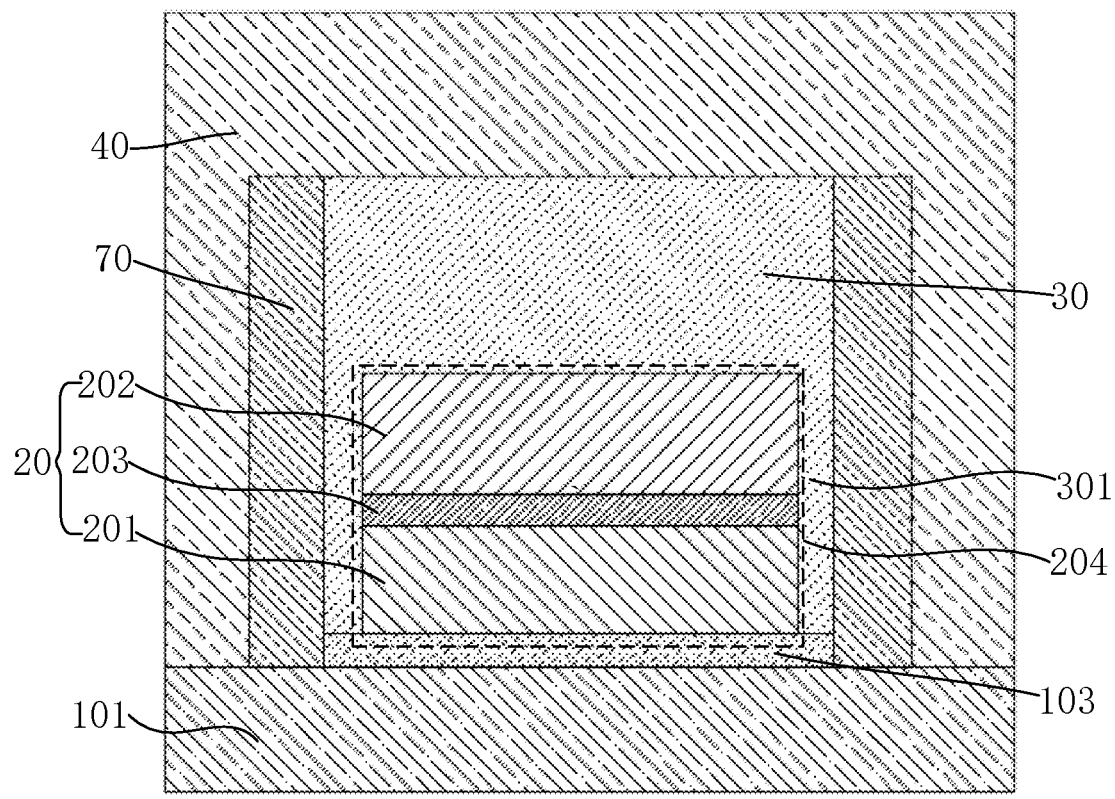
FIG. 20 is a sectional view in an L-L direction in FIG. 18.
Figure 21:
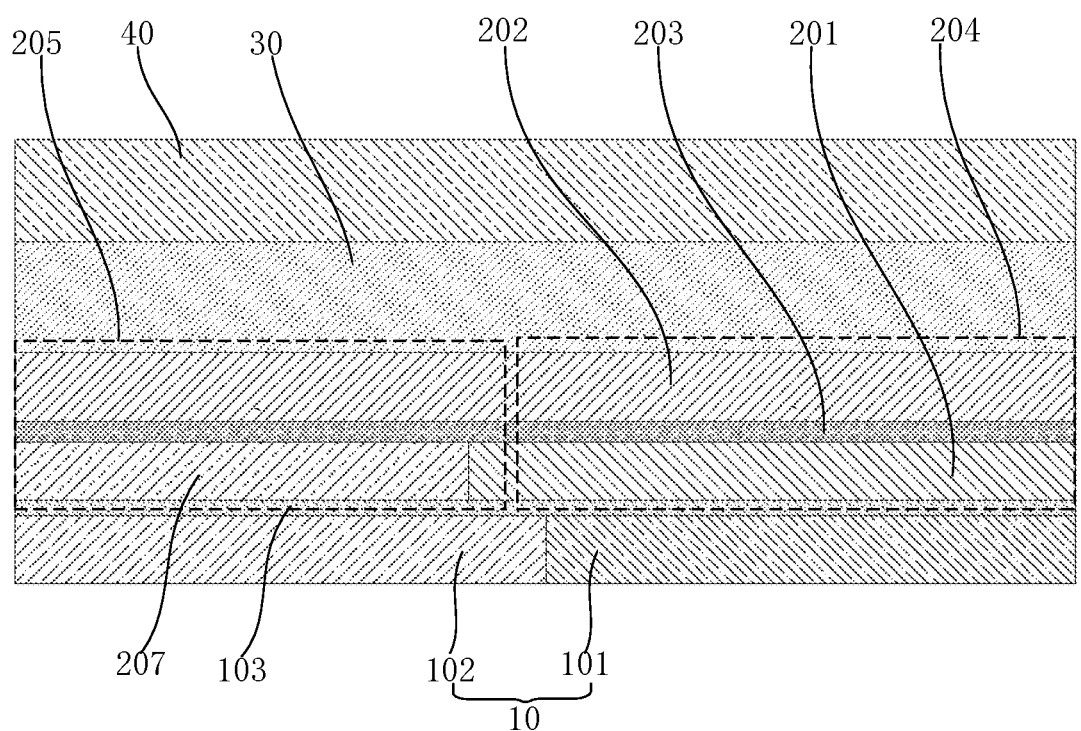
FIG. 21 is a sectional view in an M-M direction in FIG. 18.
Figure 22:
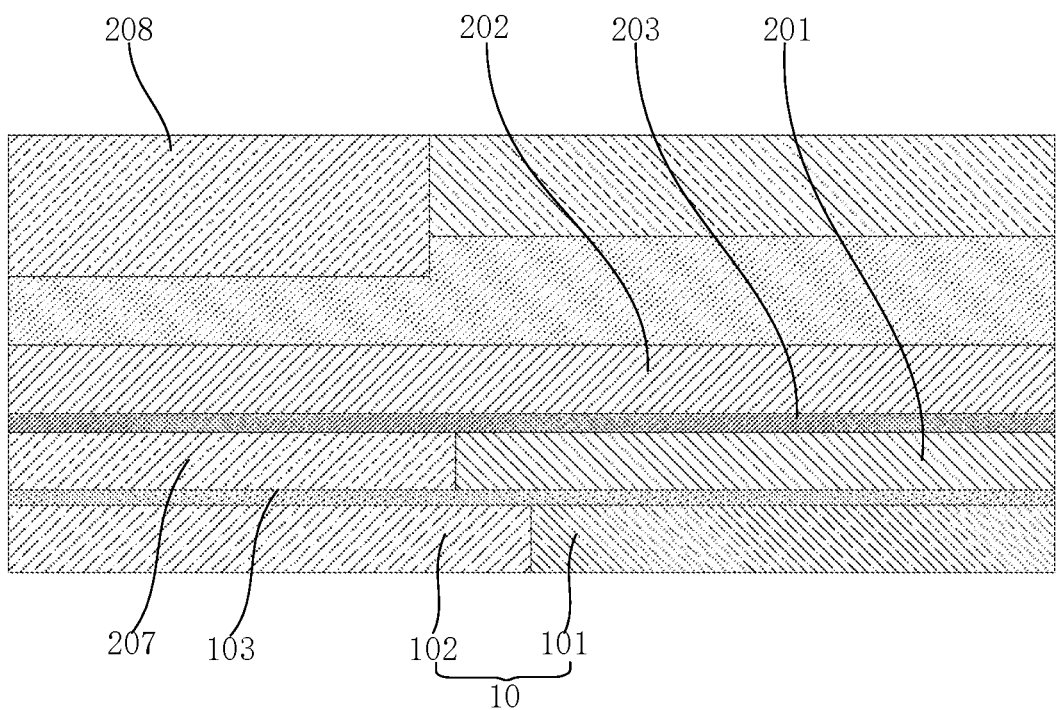
FIG. 22 is a sectional view in an N-N direction in FIG. 18.

Further referring to FIG. 5 and FIG. 16, after the channel 401 is formed, the method further includes the following operation.

At S105, at least part of the first conductive layer, a projection of which is located on the insulating substrate, is removed through the channel to form a groove.

Illustratively, the whole of the second conductive layer 202, the projection of which covers the insulating substrate 102 may be removed. Of course, a part of the first conductive layer 201, the projection of which covers the insulating substrate 102 may be removed to form a groove 206, which is not limited in the embodiment.

Further referring to FIG. 5 and FIG. 17 to FIG. 22, after the groove 206 is formed, the method further includes the following operation.

At S106, an insulator is formed, through the channel, in the groove.

An insulator 207 may be filled into the groove 206 to support the second conductive layer 202, so that the groove 206 is prevented from collapsing.

Materials of the insulator 207 may include insulating materials such as silicon nitride, silicon oxide and nitride oxide silicon. Materials of the insulator 207 are not limited in the embodiment.

According to the method for manufacturing the semiconductor structure in the embodiment, the substrate 10 includes the semiconductor substrate 101 and the insulating substrate 102. The gate dielectric layer 103, the first conductive layer 201, the second conductive layer 202 and the insulating covering layer 40 that are stacked are formed on the substrate 10. The insulating covering layer 40 covers the second conductive layer 202 and the substrate 10. The first conductive layer 201 and the second conductive layer 202 that are stacked together form the conductive layer 20. The conductive layer 20 includes the gate conductor layer 204, the projection of which on the substrate 10 covers the semiconductor substrate 101, and the external connecting layer 205, the projection of which on the substrate 10 covers the insulating substrate 102. The first conductive layer 201 corresponding to the external connecting layer 205 is removed to form the groove 206 which is filled with the insulator 207. A volume of the external connecting layer 205 may be reduced through the insulator 207 arranged in the groove 206, so that electric leakage between the external connecting layer 205 and other conductive film layers is avoided, and the therefore properties of the semiconductor structure are improved.

Further referring to FIG. 10 to FIG. 13, the method for manufacturing the semiconductor structure provided in the embodiment further includes the following operations. Before forming the insulating covering layer 40, a gate insulating layer 30 covering the second conductive layer 202 is formed on the first conductive layer 201 and the second conductive layer 202. The gate insulating layer 30 is provided with insulating side walls 301 each extending onto a respective one of side walls, perpendicular to the substrate 10, of the first conductive layer 201 and the second conductive layer 202.

Materials of the gate insulating layer 30 may include silicon oxide, silicon nitride and the like. The gate insulating layer 30 covers a top surface, away from the substrate 10, of the first conductive layer 201 and side walls between the top surface and a bottom surface of the first conductive layer 201. In such a manner, the first conductive layer 201 is isolated from the second conductive layer 202.

In some embodiments, after the gate insulating layer 30 is formed, the method further includes the following operations. A side wall insulating layer 70 fitted to the insulating inner side wall 301 is formed on the insulating inner side wall 301. The side wall insulating layer 70 may protect the gate insulating layer 30. Illustratively, materials of the side wall insulating layer 70 may include silicon oxide, silicon nitride and the like.

As shown in FIG. 14 to FIG. 17, a part of the side wall insulating layer 70 and the insulating covering layer 40 outside the side wall insulating layer 70 may be etched when forming the channel 401. A part of the insulating covering layer 40 and the side wall insulating layer 70 may be retained between the bottom end of the channel 401 and the gate dielectric layer 103. Before the operation of forming the groove 206, the method further includes the following operations. The gate insulating layer 30 is etched through the channel 401 to remove an insulating side wall 301 directly facing the insulating substrate 102, so as to form a side wall opening. In the process of forming the side wall opening, the insulating covering layer 40 and the side wall insulating layer 70 at the bottom end of the channel 401 and the gate dielectric layer 103 may be further etched, so that the bottom end of the channel 401 extends to the gate dielectric layer 103. An etching slot is formed in the top end, away from the substrate 10, of the gate insulating layer 30.

The operation of forming the groove 206 includes the following operations. At least part of the first conductive layer 201, the projection of which is located on the insulating substrate 102, is removed through the channel 401 and the side wall opening, so as to form the groove 206.

At least part of the first conductive layer 201, the projection of which is located on the insulating substrate 102, is removed through the side wall opening and the channel 401 to form the groove 206, so that the manufacturing difficulty of the semiconductor structure is simplified.

In the embodiment, an insulating filler 208 is formed in the channel 401 while forming, through the channel 401, the insulator 207 in the groove 206. In such a manner, the insulating filler 208 and the insulator 207 are the same in material and are formed through the same process step. That is, the insulating filler 208 is integral with the insulator 207, so that the manufacturing difficulty of the semiconductor structure may be reduced.

Further referring to FIG. 10 to FIG. 22, the method further includes the following operations. A third conductive layer 203 is formed on the first conductive layer 201 before forming the second conductive layer 202. The third conductive layer 203 is bonded to the first conductive layer 201 and to the second conductive layer 202, so that the first conductive layer 201 is connected to the second conductive layer 202 through the third conductive layer 203. Materials of the third conductive layer 203 may include tungsten, titanium, polycrystalline silicon, and the like.

In some implementations, the third conductive layer 203 may be removed while the second conductive layer 202 is removed through the side wall opening, that is, the groove 206 penetrates through the second conductive layer 202 and the third conductive layer 203. In such a manner, electric leakage between the external connecting layer 205 and other film layers may be further avoided.

In the embodiment, after the insulator 207 and the insulating filler 208 are formed, a wire connection part further may be formed on the insulating covering layer 40. The wire connection part may be in contact with the second conductive layer 202 after passing through the insulating covering layer 40 and the gate insulating layer 30. To reduce resistance between the wire connection part and the second conductive layer 202, a pit may be formed on the top surface, away from the substrate 10, of the second conductive layer 202. A part of the wire connection part is contained in the pit. In such a manner, the external connecting layer 205 may be connected to the external device through the wire connection part to realize functions such as signal transmission and detection.

The wire connection part may include a first wire connection part and a second wire connection part covering the first wire connection part. Materials of the first conductive layer may include tungsten, aluminum, tungsten silicide, polycrystalline silicon and the like. Materials of the second conductive layer may include tungsten, aluminum, and the like.

Finally, it should be noted that the above embodiments are only used to illustrate the technical solutions of the present disclosure and shall not be construed as limitation. Although the present disclosure has been described in detail with reference to the foregoing embodiments, a person of ordinary skill in the art should understand that modifications or equivalent substitutions may be made on the technical solutions recorded in the embodiments or part of all technical features of these technical solutions. These modifications or equivalent substitutions do not deviate the technical solutions from the scope of the technical solutions embodied in the embodiments of the present disclosure.

What is claimed is:

1. A semiconductor structure, comprising
a substrate, a gate dielectric layer and a conductive layer that are stacked, the gate dielectric layer being located between the substrate and the conductive layer,
wherein the substrate comprises a semiconductor substrate and an insulating substrate which are arranged on the same layer,
wherein the conductive layer comprises: a gate conductor layer, a projection of which on the substrate covers the semiconductor substrate, and an external connecting layer, a projection of which on the substrate covers the insulating substrate, and
a groove being formed on a bottom surface, towards the substrate, of the external connecting layer, and the groove being filled with an insulator,
wherein the conductive layer comprises a first conductive layer and a second conductive layer that are stacked, the first conductive layer is arranged to be close to the substrate, and the groove is formed on a bottom surface, towards the substrate, of the first conductive layer, the groove penetrates through the first conductive layer corresponding to the external connecting layer.

2. The semiconductor structure of claim 1, wherein the conductive layer further comprises a third conductive layer located between the first conductive layer and the second conductive layer, the third conductive layer being bonded to the first conductive layer and to the second conductive layer.

3. The semiconductor structure of claim 1, further comprising:
a wire connection part, wherein one end of the wire connection part is connected to a side, away from the substrate, of the external connecting layer, and the other end of the wire connection part extends in a direction away from the substrate, wherein the wire connection part is configured to be connected to an external device.

4. The semiconductor structure of claim 1, further comprising:
a gate insulating layer which covers a side, away from the substrate, of the conductive layer, wherein the gate insulating layer has insulating side walls each extending to a respective one of side walls, perpendicular to the substrate, of the conductive layer.

5. The semiconductor structure of claim 4, wherein a side wall opening which communicates with the groove is formed on an insulating side wall corresponding to the external connecting layer.

6. The semiconductor structure of claim 5, further comprising:

an insulating covering layer which covers the gate insulating layer and the substrate,
wherein a channel is arranged on the insulating covering layer, the channel extending to the gate dielectric layer and communicating with the side wall opening, and the channel being filled with an insulating filler.

7. The semiconductor structure of claim 6, wherein the insulating filler is integral with the insulator.

8. A method for manufacturing a semiconductor structure, comprising:
providing a substrate, the substrate comprising a semiconductor substrate and an insulating substrate which are arranged on the same layer;
forming, on the substrate, a gate dielectric layer, a first conductive layer, a second conductive layer and an insulating covering layer that are stacked, the insulating covering layer covering the first conductive layer and the substrate;
forming a mask layer on the insulating covering layer, the mask layer having an etching hole, and a projection of a part of the etching hole on the insulating substrate overlapping with a projection of the second conductive layer on the insulating substrate;
removing the insulating covering layer corresponding to the etching hole to form a channel, the channel at least extending into the gate dielectric layer;
removing, through the channel, at least part of the first conductive layer, a projection of which is located on the insulating substrate, to form a groove; and
forming, through the channel, an insulator in the groove.

9. The method for manufacturing the semiconductor structure of claim 8, further comprising:
before forming the insulating covering layer, forming a gate insulating layer on the first conductive layer and the second conductive layer, the gate insulating layer covering the second conductive layer and the gate insulating layer having insulating side walls each extending to a respective one of side walls, perpendicular to the substrate, of the first conductive layer and the second conductive layer; and
further comprising: before forming the groove, etching the gate insulating layer through the channel to remove an insulating side wall directly facing the insulating substrate, so as to form a side wall opening,
wherein forming the groove comprises: removing, through the channel and the side wall opening, at least part of the first conductive layer, a projection of which is located on the insulating substrate, so as to form the groove.

10. The method for manufacturing the semiconductor structure of claim 8, wherein an insulating filler is formed in the channel while forming, through the channel, the insulator in the groove.

11. The method for manufacturing the semiconductor structure of claim 8, further comprising:
prior to said forming the second conductive layer, forming a third conductive layer on the first conductive layer.

12. A semiconductor structure, comprising
a substrate, a gate dielectric layer and a conductive layer that are stacked, the gate dielectric layer being located between the substrate and the conductive layer,
wherein the substrate comprises a semiconductor substrate and an insulating substrate which are arranged on the same layer,
wherein the conductive layer comprises: a gate conductor layer, a projection of which on the substrate covers the semiconductor substrate, and an external connecting layer, a projection of which on the substrate covers the insulating substrate,
a groove being formed on a bottom surface, towards the substrate, of the external connecting layer, and the groove being filled with an insulator,
wherein the conductive layer comprises a first conductive layer and a second conductive layer that are stacked, the first conductive layer is arranged to be close to the substrate, and the groove is formed on a bottom surface, towards the substrate, of the first conductive layer, and
the conductive layer further comprises a third conductive layer located between the first conductive layer and the second conductive layer, the third conductive layer being bonded to the first conductive layer and to the second conductive layer.

* * * * *